(12) United States Patent
Watanabe et al.

(10) Patent No.: US 10,964,884 B2
(45) Date of Patent: Mar. 30, 2021

(54) MAGNETIC MEMORY DEVICE HAVING AN INCLINE SIDE SURFACE

(71) Applicant: TOSHIBA MEMORY CORPORATION, Tokyo (JP)

(72) Inventors: Daisuke Watanabe, Yokkaichi Mie (JP); Toshihiko Nagase, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 42 days.

(21) Appl. No.: 16/566,557

(22) Filed: Sep. 10, 2019

(65) Prior Publication Data

US 2020/0303626 A1 Sep. 24, 2020

(30) Foreign Application Priority Data

Mar. 18, 2019 (JP) .............................. JP2019-049889

(51) Int. Cl.
| | |
|---|---|
| *H01L 27/22* | (2006.01) |
| *H01L 43/02* | (2006.01) |
| *H01L 43/12* | (2006.01) |
| *H01L 43/10* | (2006.01) |

(52) U.S. Cl.
CPC ............ *H01L 43/02* (2013.01); *H01L 27/222* (2013.01); *H01L 43/10* (2013.01); *H01L 43/12* (2013.01)

(58) Field of Classification Search
CPC ....... H01L 27/20; H01L 27/22; H01L 27/222; H01L 27/224
See application file for complete search history.

(56) References Cited

U.S. PATENT DOCUMENTS

| | | | |
|---|---|---|---|
| 9,564,577 B1 * | 2/2017 | Hsu ......................... | H01L 43/02 |
| 2008/0180859 A1 | 7/2008 | Ueda et al. | |
| 2012/0074511 A1 | 3/2012 | Takahashi et al. | |
| 2012/0230091 A1 | 9/2012 | Yanagi et al. | |
| | (Continued) | | |

FOREIGN PATENT DOCUMENTS

| | | |
|---|---|---|
| JP | 4384183 B2 | 1/2007 |
| JP | 5214691 B2 | 6/2013 |
| | (Continued) | |

OTHER PUBLICATIONS

Watanabe, et al., "Shape anisotropy revisited in single-digit nanometer magnetic tunnel junctions", Nature Communications 9, Article No. 663, 2018, pp. 1-6.

*Primary Examiner* — Hoai V Pham
(74) *Attorney, Agent, or Firm* — Holtz, Holtz & Volek PC

(57) ABSTRACT

According to one embodiment, a magnetic memory device includes a stacked structure including a first magnetic layer having a variable magnetization direction, a second magnetic layer having a fixed magnetization direction, and a nonmagnetic layer provided between the first magnetic layer and the second magnetic layer. The first magnetic layer includes a first surface in contact with the nonmagnetic layer and a second surface on an opposite side to the first surface, a diameter of the second surface of the first magnetic layer is less than a diameter of the first surface of the first magnetic layer and is 10 nm or more, and a ratio of a height of the first magnetic layer to the diameter of the second surface of the first magnetic layer is 0.9 or more.

16 Claims, 10 Drawing Sheets

(56) References Cited

U.S. PATENT DOCUMENTS

2016/0233416 A1 8/2016 Ikeda et al.
2017/0263858 A1 9/2017 Sonoda et al.
2018/0076262 A1 3/2018 Eeh et al.

FOREIGN PATENT DOCUMENTS

JP 5542831 B2 7/2014
TW I621120 B 4/2018

* cited by examiner

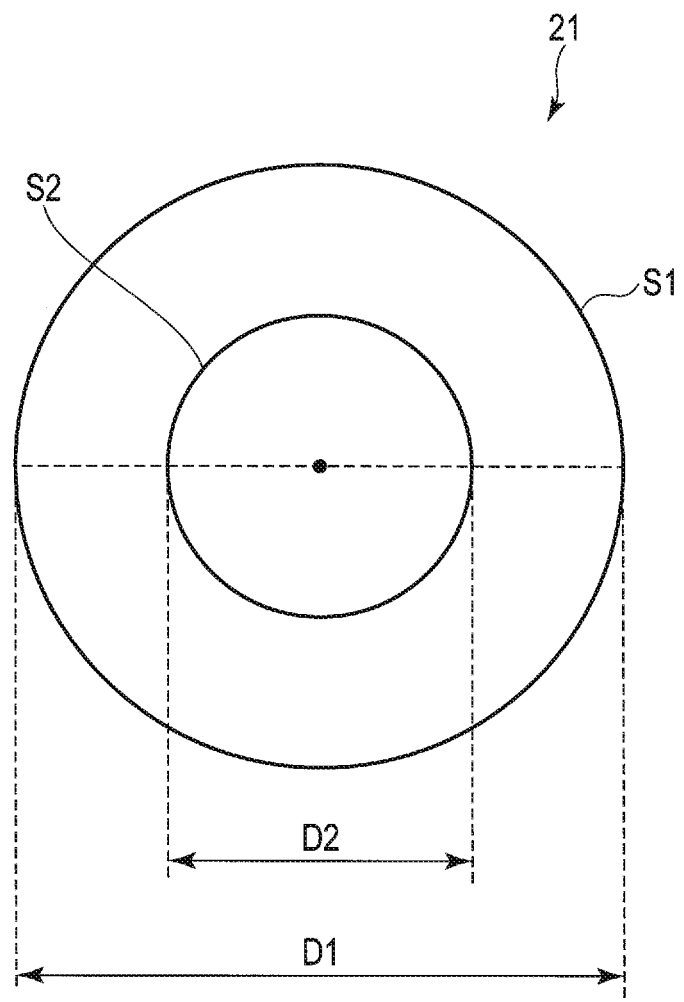
F I G. 2

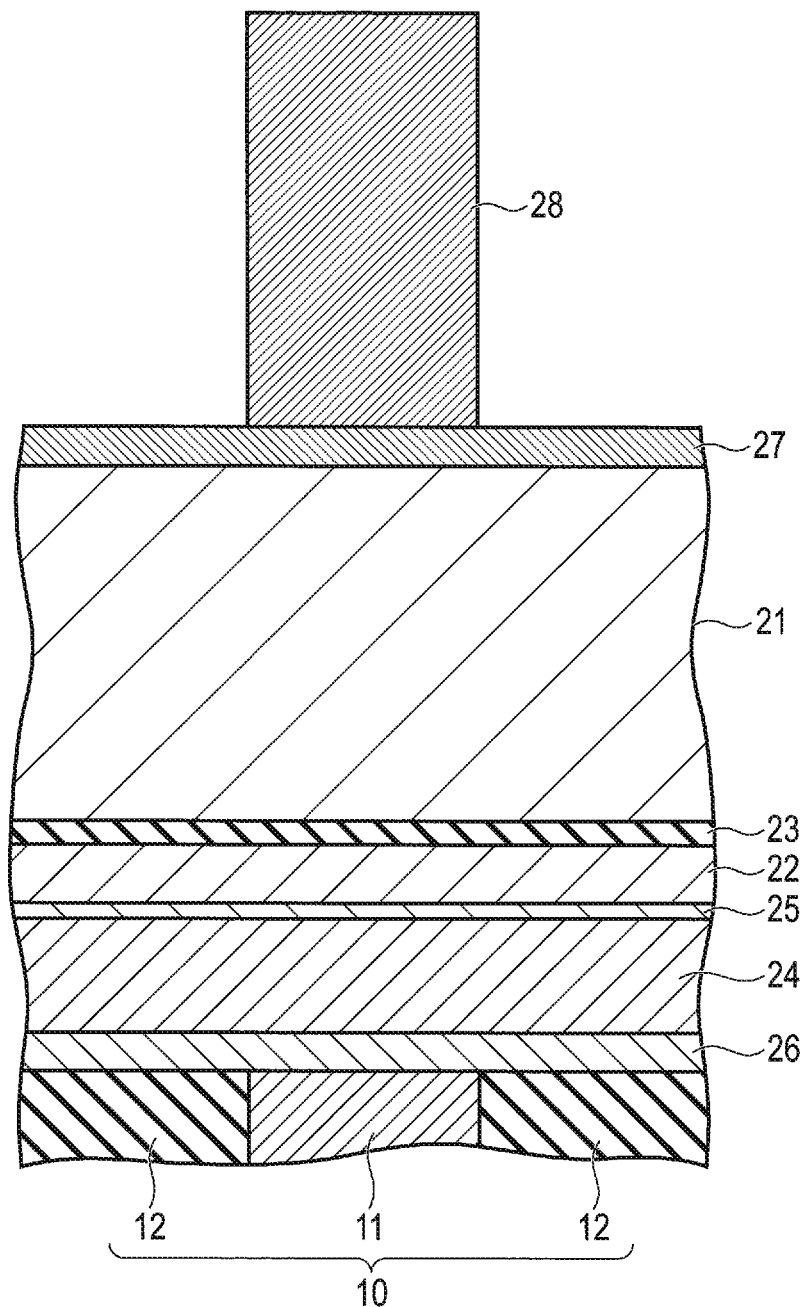
F I G. 4

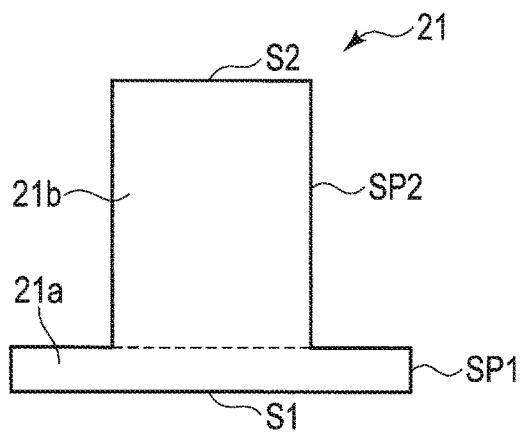
F I G. 8
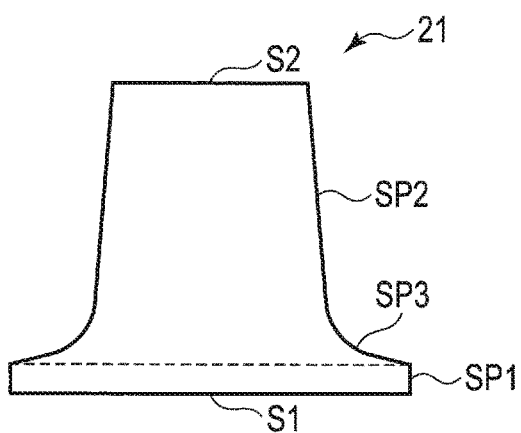
F I G. 9
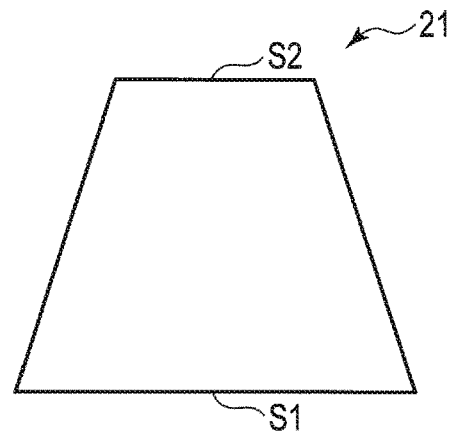
F I G. 10

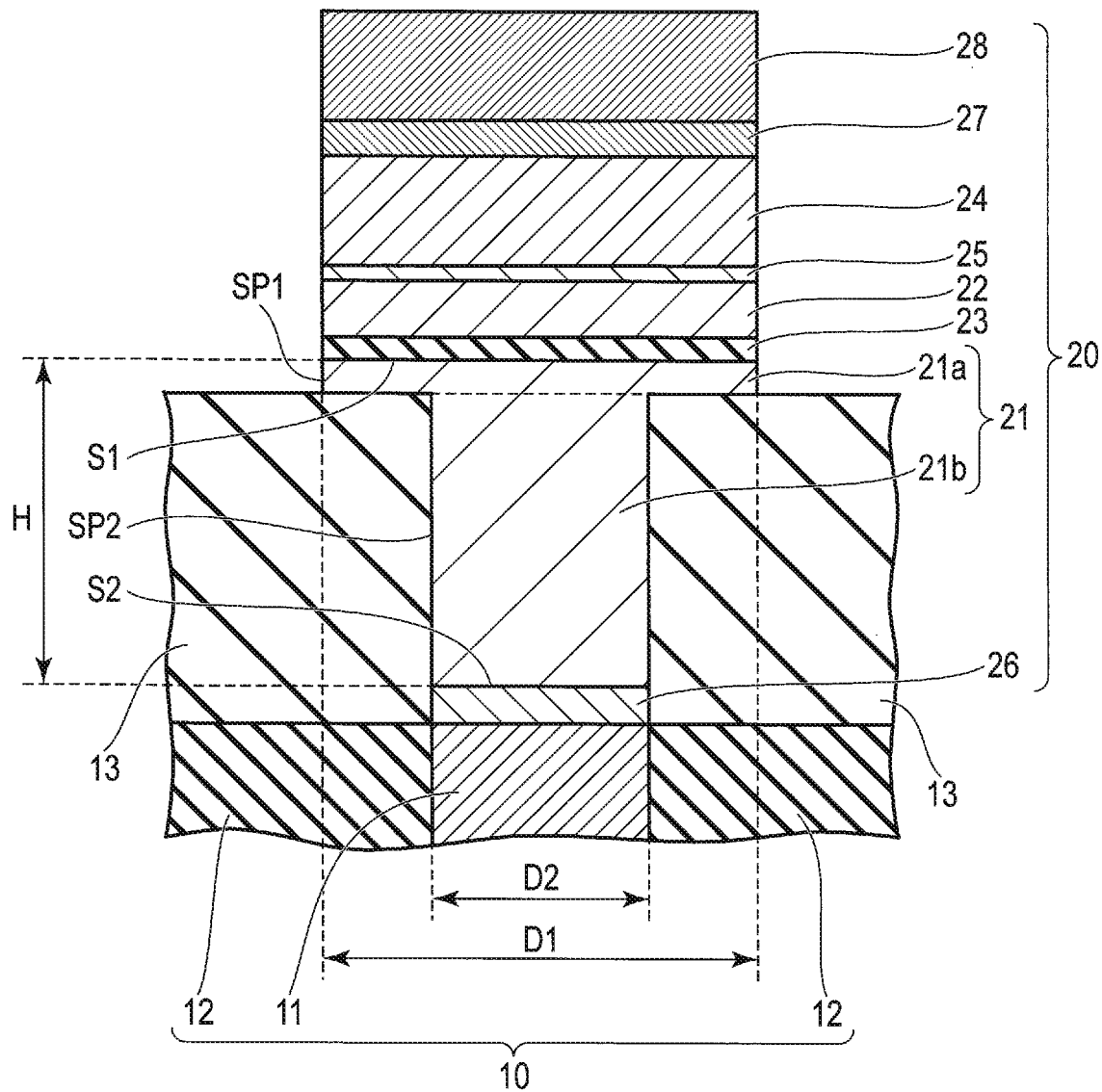
F I G. 11

US 10,964,884 B2

MAGNETIC MEMORY DEVICE HAVING AN INCLINE SIDE SURFACE

CROSS-REFERENCE TO RELATED APPLICATIONS

This application is based upon and claims the benefit of priority from Japanese Patent Application No. 2019-049889, filed Mar. 18, 2019, the entire contents of which are incorporated herein by reference.

FIELD

Embodiments described herein relate generally to a magnetic memory device.

BACKGROUND

Magnetic memory devices (semiconductor integrated circuit device) in which magnetoresistive elements and transistors are integrated on a semiconductor substrate, have been proposed. In particular, for high integration of a magnetic memory device, the magnetoresistive element which has perpendicular magnetization is effective. However, as the size of the magnetoresistive element becomes finer, it becomes more difficult to achieve high perpendicular magnetic anisotropy in the magnetoresistive element.

BRIEF DESCRIPTION OF THE DRAWINGS

FIG. 2 is a diagram schematically showing the relationship between a first surface and a second surface of a storage layer in the magnetic memory device according to the embodiment.

FIG. 4 is a cross section schematically illustrating a part of a method of manufacturing the magnetic memory device according to the embodiment.

FIG. 8 is a cross section schematically showing a structure of the first modified example of the storage layer in the magnetic memory device according to the embodiment.

FIG. 9 is a cross section schematically showing a structure of the second modified example of the storage layer in the magnetic memory device according to the embodiment.

FIG. 10 is a cross section schematically showing a structure of the third modified example of the storage layer in the magnetic memory device according to the embodiment.

FIG. 11 is a cross section schematically showing a structure of a magnetic memory device according to a modified example of the embodiment.

DETAILED DESCRIPTION

In general, according to one embodiment, a magnetic memory device includes: a stacked structure including: a first magnetic layer having a variable magnetization direction; a second magnetic layer having a fixed magnetization direction; and a nonmagnetic layer provided between the first magnetic layer and the second magnetic layer, wherein the first magnetic layer includes a first surface in contact with the nonmagnetic layer and a second surface on an opposite side to the first surface, a diameter of the second surface of the first magnetic layer is less than a diameter of the first surface of the first magnetic layer and is 10 nm or more, and a ratio of a height of the first magnetic layer to the diameter of the second surface of the first magnetic layer is 0.9 or more.

Various embodiments will be described below with reference to the accompanying drawings.

Figure 1:
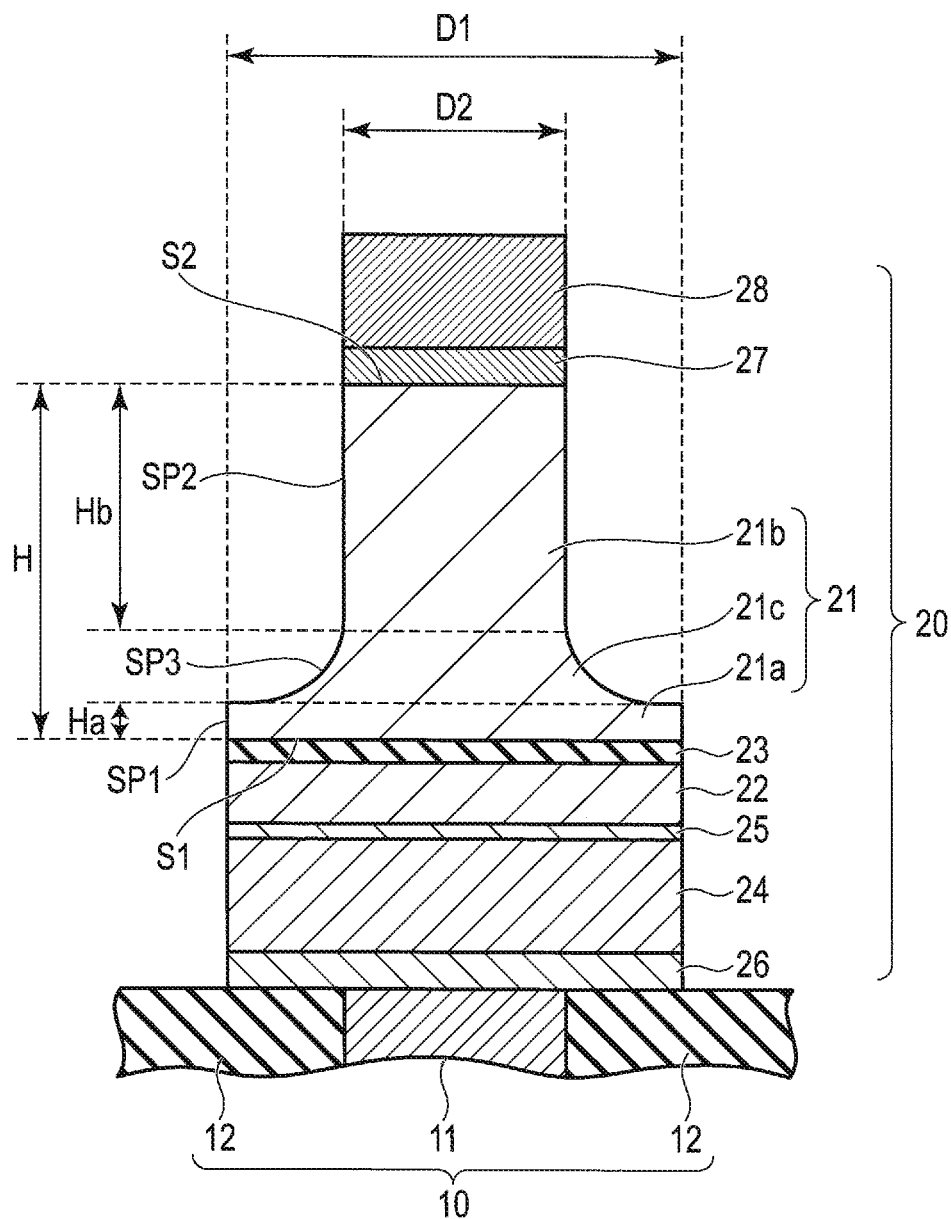
FIG. 1 is a cross section schematically showing a structure of a magnetic memory device according to an embodiment.

FIG. 1 is a cross section schematically showing the structure of a magnetic memory device according to an embodiment.

As shown in FIG. 1, a stacked structure 20 which constitutes a magnetoresistive element is provided on a lower structure 10. Note that the magnetoresistive element may be referred to as magnetic tunnel junction (MTJ) element.

The lower structure 10 contains a semiconductor substrate (not shown), a transistor (not shown), a bottom electrode 11 for the magnetoresistive element, interlayer insulating films 12 and the like.

The stacked structure 20 includes a storage layer (first magnetic layer) 21, a reference layer (second magnetic layer) 22, and a tunnel barrier layer (nonmagnetic layer) 23 provided between the storage layer 21 and the reference layer 22. In this embodiment, the stacked structure 20 further includes a shift canceling layer 24, an intermediate layer 25, a buffer layer 26, a cap layer 27, and a hard mask layer 28.

The storage layer (first magnetic layer) 21 is a ferromagnetic layer which has a variable magnetization direction, and contains at least one of iron (Fe) and cobalt (Co). The storage layer 21 may further contain boron (B). In this embodiment, the storage layer 21 is formed from a CoFeB layer. Note that a variable magnetization direction means that the magnetization direction varies with respect to a predetermined write current value. The storage layer 21 will be described in detail later.

The reference layer (second magnetic layer) 22 is a ferromagnetic layer which has a fixed magnetization direction. The reference layer 22 includes a first layer portion on a tunnel barrier layer 23 side and a second layer portion on a shift canceling layer 24 side. The first layer portion contains at least one of iron (Fe) and cobalt (Co). The first layer portion may further contain boron (B). In this embodiment, the first layer portion is formed from a CoFeB layer. The second layer portion contains cobalt (Co) and at least one element selected from platinum (Pt), nickel (Ni) and palladium (Pd). In this embodiment, the second layer portion is formed from a superlattice of Co/Pt, Co/Ni or Co/Pd. Note that a fixed magnetization direction means that the magnetization direction does not vary with respect to a predetermined write current value.

The tunnel barrier layer (nonmagnetic layer) 23 is an insulating layer interposed between the storage layer 21 and the reference layer 22, and contains magnesium (Mg) and oxygen (O). In this embodiment, the tunnel barrier layer 23 is formed from an MgO layer.

The shift canceling layer 24 is a ferromagnetic layer which has a fixed magnetization direction, and has a function of cancelling a magnetic field applied from the reference layer 22 to the storage layer 21. The shift canceling layer 24 contains cobalt (Co) and at least one element selected from platinum (Pt), nickel (Ni) and palladium (Pd). In this embodiment, the shift canceling layer 24 is formed from a superlattice of Co/Pt, Co/Ni, or Co/Pd.

The magnetoresistive element comprising the stacked structure 20 described above is a spin transfer torque (STT) magnetoresistive element which has perpendicular magnetization. That is, the magnetization direction of the storage layer 21 is perpendicular to the main surface thereof, and the magnetization direction of the reference layer 22 is perpendicular to the main surface thereof.

The magnetoresistive element described above, when the magnetization direction of the storage layer 21 is parallel to the magnetization direction of the reference layer 22, is in a low-resistance state, whereas when the magnetization direction of the storage layer 21 is antiparallel to the magnetization direction of the reference layer 22, the magnetoresistive element is in a high-resistance state. Therefore, based on the resistance state (low-resistance state/high-resistance state) of the storage layer 21, binary data can be set to the magnetoresistive element. The magnetization direction of the storage layer 21 can be set according to the direction of the write current to the magnetoresistive element.

Next, the storage layer (first magnetic layer) 21 will be described in detail.

The storage layer 21 includes a first surface (a lower surface in FIG. 1) S1 which is in contact with the tunnel barrier layer 23, and a second surface (an upper surface in FIG. 1) S2 on an opposite side to the first surface S1.

FIG. 2 is a diagram schematically showing the relationship between the first surface S1 and the second surface S2 of the storage layer 21. As shown in FIG. 2, a diameter D2 of the second surface S2 is less than a diameter D1 of the first surface S1 and is 10 nm or more. Moreover, the diameter D2 of the second surface S2 should preferably be 30 nm or less.

Note that, as shown in FIG. 2, ideally, it is preferable that the first surface S1 and the second surface S2 of the storage layer 21 each should be a perfect circle (a true circle), and also a section (, which is parallel to the first surface S1 and the second surface S2) of the storage layer 21 be a perfect circle (a true circle). However, in reality, it is difficult to form the storage layer 21 such as to include the first surface S1 and the second surface S2 of perfect circles due to the manufacturing process or the like. Under these circumstances, here, the diameter D1 of the first surface S1 of the storage layer 21 and the diameter D2 of the second surface S2 are defined based on the formula to obtain the area of a circle. That is, when the area of the first surface S1 is defined as A1 and the area of the second surface S2 is defined as A2, the diameter D1 of the first surface S1 and the diameter D2 of the second surface S2 are defined by the following formulas:

$A1 = \pi(D1/2)^2$ $A2 = \pi(D2/2)^2$

As shown in FIG. 1, the ratio of a height H (a height from the first surface S1 to the second surface S2) of the storage layer 21 with respect to the diameter D2 of the second surface S2 of the storage layer 21, that is, H/D2, is 0.9 or more.

The storage layer 21 comprises a side surface including a first side-surface portion SP1 on a first surface S1 side, a second side-surface portion SP2 on a second surface S2 side, and a third side-surface portion SP3 located between the first side-surface portion SP1 and the second side-surface portion SP2, and the inclination of the third side-surface portion SP3 is more gentle than the inclination of the first side-surface portion SP1 or the inclination of the second side-surface portion SP2. In other words, the first side-surface portion SP1 and the second side-surface portion SP2 are inclined by an inclination angle of 90 degrees or close to 90 degrees, and the inclination angle of the third side-surface portion SP3 has changed from 90 degrees or an angle close to 90 degrees to 0 degree or an angle close to 0 degree.

Note here that a portion corresponding to the first side-surface portion SP1 of the storage layer 21 is referred to as a first layer portion 21a, and similarly, a portion corresponding to the second side-surface portion SP2 of the storage layer 21 as a second layer portion 21b, and a portion corresponding to the third side-surface portion SP3 of the storage layer 21 as a third layer portion 21c. With the definitions, a height Hb of the second layer portion 21b of the storage layer 21 is greater than a height Ha of the first layer portion 21a of the storage layer 21. Moreover, the height Ha of the first layer portion 21a of the storage layer 21 should preferably be 3 nm or less, and more preferably, 2 nm or less.

For example, the diameter D1 of the first surface S1 of the storage layer 21 is about 20 nm, and the diameter D2 of the second surface S2 is about 10 nm. The height Ha of the first layer portion 21a of the storage layer 21 is about 1.5 nm, and the height Hb of the second layer portion 21b is about 15 nm.

The magnetic memory device of this embodiment has such a structure as described above, and thus a magnetoresistive element which has high perpendicular magnetic anisotropy can be obtained. Hereafter, an explanation therefor will be added.

The magnetic anisotropy of a storage layer includes crystal magnetic anisotropy, shape magnetic anisotropy and interface magnetic anisotropy. In order to enhance perpendicular magnetic anisotropy based on the shape magnetic anisotropy, it is effective to increase an aspect ratio of the storage layer (, which is a ratio of the height H of the storage layer to the diameter D, (H/D)). In order to enhance perpendicular magnetic anisotropy based on the interface magnetic anisotropy, it is effective to enlarge the area of the storage layer.

Note, however, if the size of a magnetoresistive element is reduced, the area of the storage layer is decreased as well. Further, from viewpoints of the manufacturing process and the like, it becomes difficult to form a storage layer with a high aspect ratio. Therefore, if the size of the magnetoresistive element is reduced, it becomes difficult to obtain a magnetoresistive element with high perpendicular magnetic anisotropy.

Figure 3:
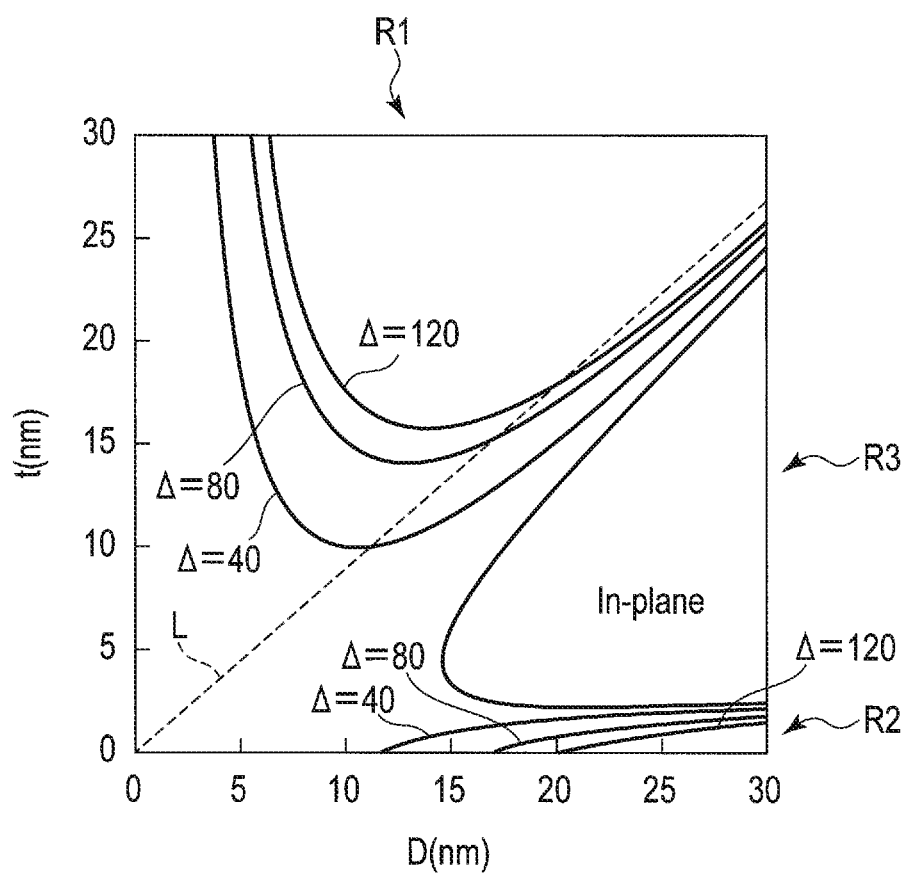
FIG. 3 is a diagram showing the relationship, when a CoFeB layer is used as a storage layer, between a diameter D and a thickness t (, which corresponds to a height H) of the storage layer, and a thermal stability Δ of the storage layer at room temperature.

FIG. 3 is a diagram showing the relationship between the diameter D and the thickness t (, which corresponds to the height H) of the storage layer, and a thermal stability Δ of the storage layer at room temperature when a CoFeB layer is used as the storage layer.

In order to obtain a storage layer with high perpendicular magnetic anisotropy, it is important to improve the thermal stability Δ of the storage layer. Generally, it is required that the thermal stability Δ of the storage layer at room temperature should be 80 or higher.

In FIG. 3, a region R1 is a region where the shape magnetic anisotropy is predominant, a region R2 is a region where the interface magnetic anisotropy is predominant, and a region R3 is a region where the in-plane magnetization (horizontal (surface direction) magnetization) is dominant.

As shown in FIG. 3, if the diameter D of the storage layer is reduced, it is difficult to obtain a storage layer having a high thermal stability Δ of about 80 or higher, in the dominant region R2 where the interface magnetic anisotropy is predominant. In the dominant region R1 where the shape magnetic anisotropy is predominant, it is possible, by increasing the aspect ratio (H/D), to obtain a storage layer having a high thermal stability Δ of about 80 or higher. However, even in the region R1, if the diameter D of the storage layer is less than about 10 nm, it is difficult to obtain a storage layer having a high thermal stability Δ of about 80 or higher unless the storage layer has an extremely high aspect ratio (H/D). Here, it is very difficult to form a storage layer having a diameter D of less than about 10 nm and at the same time, having a high aspect ratio (H/D).

Moreover, as shown in FIG. 3, in the region where the diameter D of the storage layer is about 10 nm or more, the inclination of a line where Δ=80 (the inclination of a straight line L) is substantially constant. The inclination of the straight line L corresponds to the aspect ratio (H/D), and is about 0.9. Therefore, in the region where the diameter D of the storage layer is about 10 nm or more, it is possible, by setting the aspect ratio (H/D) to 0.9 or higher, to obtain a storage layer having a high thermal stability Δ of about 80 or higher.

The above-provided arguments are considered to be generally applied not only in the case where CoFeB is used as the material for the storage layer, but also where some other ferromagnetic material is used, especially where at least one of Fe and Co is contained in the storage layer.

In this embodiment, the diameter D2 of the second surface S2 of the storage layer 21 is about 10 nm or more and the ratio (H/D2) of the height H of the storage layer 21 to the diameter D2 of the second surface S2 of the storage layer 21 is 0.9 or higher, and therefore the storage layer 21, which has a high thermal stability Δ of about 80 or higher, can be obtained. Further, in this embodiment, the diameter D1 of the first surface S1 of the storage layer 21 is greater than the diameter D2 of the second surface S2 (the diameter D2 of the second surface S2 of the storage layer 21 is less than the diameter D1 of the first surface S1), and therefore the perpendicular magnetic anisotropy in the interface between the first surface S1 of the storage layer 21 and the tunnel barrier layer 23 (, which is the perpendicular magnetic anisotropy based on the interface magnetic anisotropy) can be enhanced.

Therefore, according to this embodiment, a magnetoresistive element with high perpendicular magnetic anisotropy can be obtained, and a magnetoresistive element with high thermal stability Δ can be obtained.

In this embodiment, moreover, the height of the second layer portion 21b of the storage layer 21 is greater than the height of the first layer portion 21a (that is, the height of the first layer portion 21a of the storage layer 21 is less than the height of the second layer portion 21b). With this structure, a magnetoresistive element which can effectively realize such characteristics as discussed above can be obtained.

Next, with reference to FIGS. 4 to 7 and FIG. 1, a method of manufacturing a magnetic memory device according to this embodiment will be described.

First, as shown in FIG. 4, a stacked layer for a magnetoresistive element is formed on the lower structure 10. More specifically, the buffer layer 26, the shift canceling layer 24, the intermediate layer 25, the reference layer 22, the tunnel barrier layer 23, the storage layer 21, the cap layer 27 and the hard mask layer 28 are formed sequentially on the lower structure 10. Then, the hard mask layer 28 is patterned to form a hard mask pattern.

Figure 5:
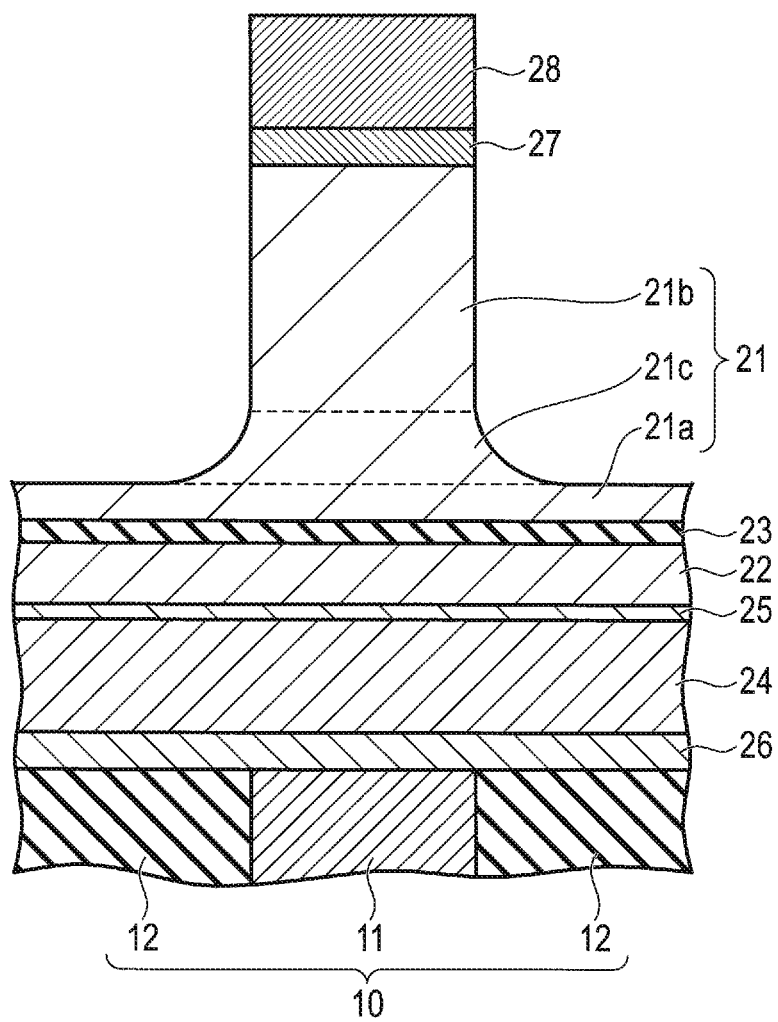
FIG. 5 is a cross section schematically illustrating a part of a method of manufacturing the magnetic memory device according to the embodiment.

Next, as shown in FIG. 5, the cap layer 27 and the storage layer 21 are subjected to etching using the patterned hard mask layer 28 as a mask. More specifically, the cap layer 27 and the storage layer 21 are etched by ion beam etching (IBE) or reactive ion etching (RIE). This etching step is carried out to make a lower layer portion of the storage layer 21 to remain. As a result, such a structure that corresponds to the first layer portion 21a, the second layer portion 21b and the third layer portion 21c, as shown in FIG. 1, is obtained. Moreover, during the etching step, the side surface of the third layer portion 21c is gently inclined.

Figure 6:
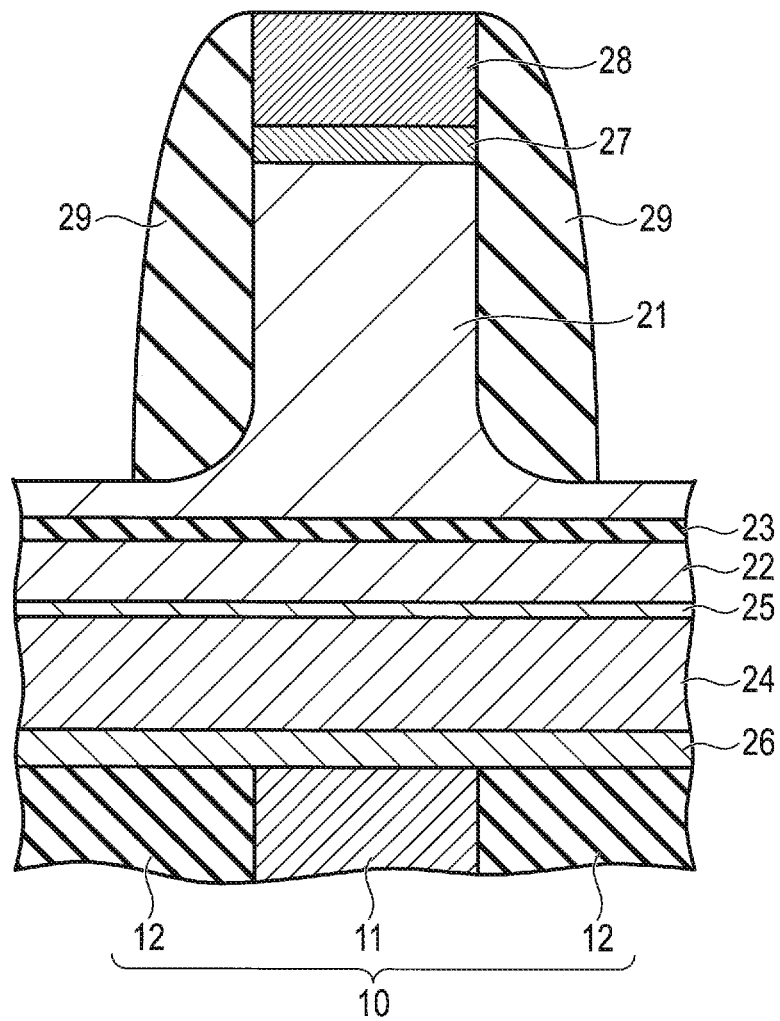
FIG. 6 is a cross section schematically illustrating a part of a method of manufacturing the magnetic memory device according to the embodiment.

Next, as shown in FIG. 6, a side-wall mask layer 29 is formed on a side surface of the storage layer 21. More specifically, an insulating layer for the side-wall mask layer 29 is formed on the entire surface so as to cover the structure shown in FIG. 5. Further, this insulating layer is etched by anisotropic etching, and thus the side-wall mask layer 29 is formed.

Figure 7:
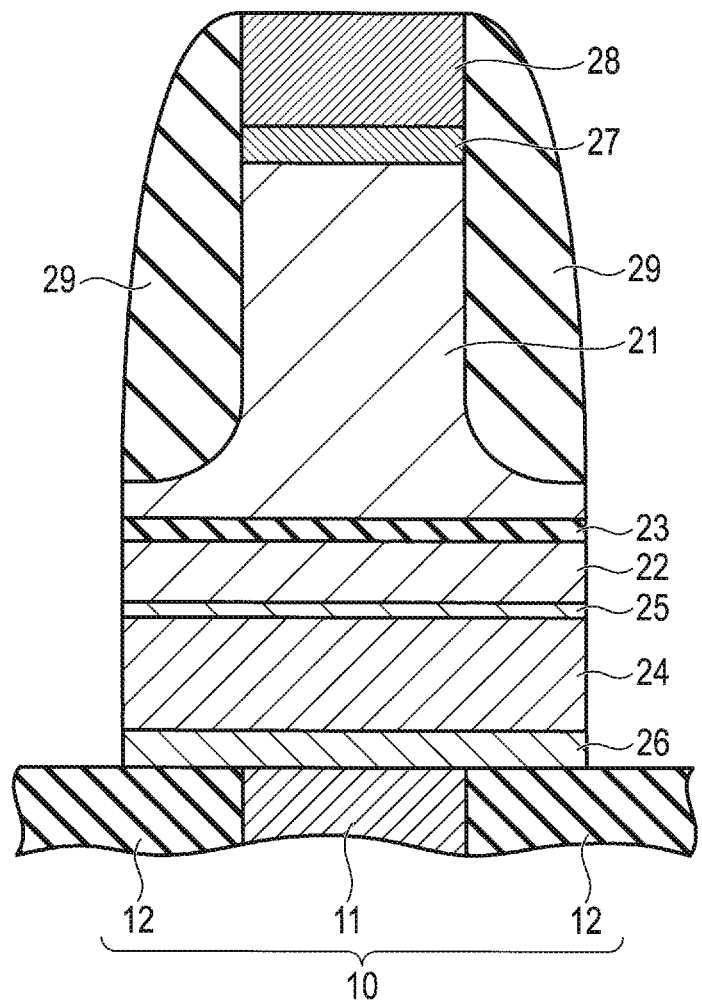
FIG. 7 is a cross section schematically illustrating a part of a method of manufacturing the magnetic memory device according to the embodiment.

Next, as shown in FIG. 7, using the side-wall mask layer 29 as a mask, the storage layer 21, the tunnel barrier layer 23, the reference layer 22, the intermediate layer 25, the shift canceling layer 24 and the buffer layer 26 are etched.

Then, the side-wall mask layer 29 is removed and thus such a structure as shown in FIG. 1 can be formed.

FIG. 8 is a cross section schematically showing a structure of the first modified example of the storage layer 21 in the magnetic memory device according to this embodiment. This modified example shows the storage layer 21 in an ideal form. That is, in this modified example, the third layer portion 21c, discussed in the embodiment provided above substantially does not exist, and the upper surface of the first layer portion 21a and the second side-surface portion SP2 are perpendicular to each other. Even with such structure, and advantageous effect similar to that of the embodiment set out above can be obtained as long as the basic structure of the storage layer 21 has a similar structure to that of the embodiment.

FIG. 9 is a cross section schematically showing a structure of the second modified example of the storage layer 21 in the magnetic memory device according to this embodiment. In the embodiment set out above, the second side-surface portion SP2 is formed perpendicular, but in this modified example, the second side-surface portion SP2 is inclined. Even with such structure, and advantageous effect similar to that of the embodiment set out above can be obtained as long as the basic structure of the storage layer 21 has a similar structure to that of the embodiment.

FIG. 10 is a cross section schematically showing a structure of the third modified example of the storage layer 21 in the magnetic memory device according to this embodiment. In this modified example, the entire side surface of the storage layer 21 is inclined. Even with such structure, and advantageous effect similar to that of the embodiment set out above can be obtained as long as the basic structure of the storage layer 21 has a similar structure to that of the embodiment.

Next, a modified example of the magnetic memory device according to this embodiment will be described.

FIG. 11 is a cross section schematically showing a structure of a magnetic memory device according to the modified example of this embodiment.

The embodiment provided above is directed to a top free magnetoresistive element, in which the reference layer 22, the tunnel barrier layer 23 and the storage layer 21 are stacked in this order from the lower layer side, whereas this modified example is directed to a bottom free magnetoresistive element in which the storage layer 21, the tunnel barrier layer 23, and the reference layer 22 are stacked in this order from the lower layer side.

In this modified example, the storage layer 21 includes a first surface S1 in contact with the tunnel barrier layer 23 and a second surface S2 on an opposite side to the first surface S1, as in the case of the embodiment described above except that, in this modified example, the upper surface of the storage layer 21 corresponds to the first surface S1 and the lower surface of the storage layer 21 corresponds to the second surface S2, which is reverse to the arrangement of the embodiment.

In this modified example, the relationship between the first surface S1 and the second surface S2 of the storage layer 21 is similar to that of the embodiment described above. That is, the diameter D2 of the second surface S2 is less than the diameter D1 of the first surface S1 and 10 nm or more, and the ratio (H/D2) of the height H of the storage layer 21 to the diameter D2 of the second surface S2 of the storage layer 21 is 0.9 or higher. Here, it is preferable that the diameter D2 of the second surface S2 be 30 nm or less.

Next, with reference to FIGS. 11 and 12, a method of manufacturing the magnetic memory device according to this modified example will be described.

Figure 12:
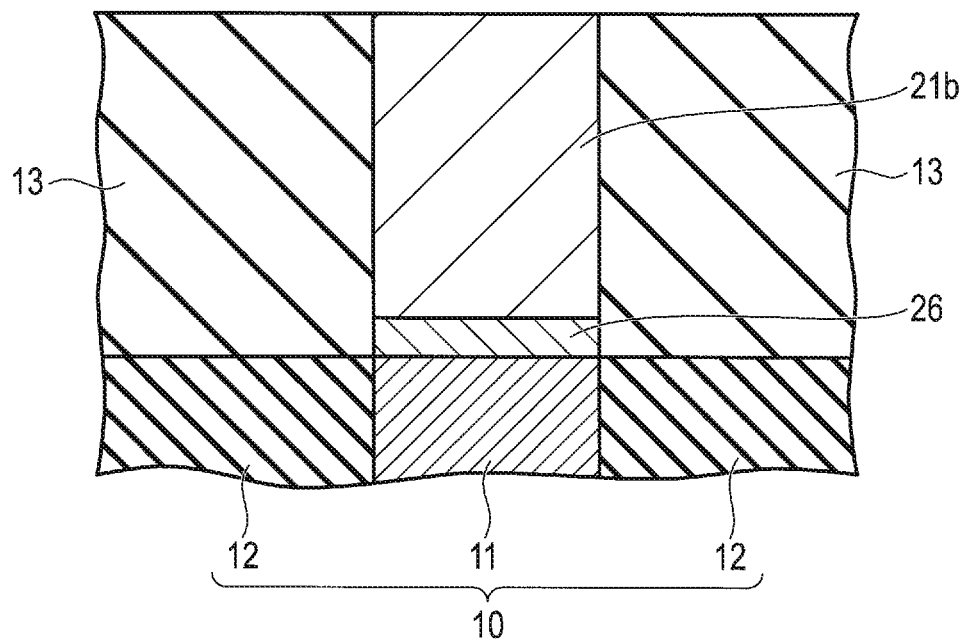
FIG. 12 is a cross section schematically illustrating a part of a method of manufacturing the magnetic memory device according to the modified example of the embodiment.

First, as shown in FIG. 12, the interlayer insulating film 13 is formed on the lower structure 10. Then, a hole is formed in the interlayer insulating film 13, and the buffer layer 26 and the second layer portion 21b of the storage layer 21 are formed in the hole.

Next, as shown in FIG. 11, on the entire surface of the structure formed in FIG. 12, a stacked layer of the second layer portion 21a of the storage layer 21, the tunnel barrier layer 23, the reference layer 22, the intermediate layer 25, the shift canceling layer 24, the cap layer 27 and the hard mask layer 28, is formed. Then, the hard mask layer 28 is patterned to form a hard mask pattern. Further, using the patterned hard mask layer 28 as a mask, the stacked layer is etched, and thus the structure shown in FIG. 11 is obtained.

As described above, even in the case of the bottom free magnetoresistive element in which the storage layer 21 is located in a lower level than the reference layer 22, a magnetoresistive element with high perpendicular magnetic anisotropy, similar to that of the embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a stacked structure comprising:
a first magnetic layer having a variable magnetization direction;
a second magnetic layer having a fixed magnetization direction; and
a nonmagnetic layer provided between the first magnetic layer and the second magnetic layer,
wherein the first magnetic layer includes a first surface in contact with the nonmagnetic layer and a second surface on an opposite side to the first surface,
a diameter of the second surface of the first magnetic layer is less than a diameter of the first surface of the first magnetic layer and is 10 nm or more, and
a ratio of a height of the first magnetic layer to the diameter of the second surface of the first magnetic layer is 0.9 or more.

2. The device of claim 1, wherein
the diameter of the second surface of the first magnetic layer is 30 nm or less.

3. The device of claim 1, wherein
a side surface of the first magnetic layer includes a first side-surface portion on a first surface side, a second side-surface portion on a second surface side, and a third side-surface portion between the first side-surface portion and the second side-surface portion, and
inclination of the third side-surface portion is more gentle than inclination of the first side-surface portion and inclination of the second side-surface portion.

4. The device of claim 3, wherein
a height of a portion of the first magnetic layer, which corresponds to the second side-surface portion is greater than a height of a portion of the first magnetic layer, which corresponds to the first side-surface portion.

5. The device of claim 3, wherein
a height of a portion of the first magnetic layer, which corresponds to the first side-surface portion is 3 nm or less.

6. The device of claim 1, wherein
the first magnetic layer contains at least one of iron (Fe) and cobalt (Co).

7. The device of claim 6, wherein
the first magnetic layer further contains boron (B).

8. The device of claim 1, wherein
the stacked structure includes the second magnetic layer, the nonmagnetic layer, and the first magnetic layer stacked in an order from a lower layer side.

9. The device of the claim 1, wherein
the magnetization direction of the first magnetic layer is perpendicular to a main surface thereof, and the magnetization direction of the second magnetic layer is perpendicular to a main surface thereof.

10. A magnetic memory device comprising:
a stacked structure comprising:
a first magnetic layer having a variable magnetization direction;
a second magnetic layer having a fixed magnetization direction; and
a nonmagnetic layer provided between the first magnetic layer and the second magnetic layer,
wherein the first magnetic layer includes a first surface in contact with the nonmagnetic layer and a second surface on an opposite side to the first surface,
a side surface of the first magnetic layer includes a first side-surface portion on a first surface side, a second side-surface portion on a second surface side, and a third side-surface portion between the first side-surface portion and the second side-surface portion, and inclination of the third side-surface portion is more gentle than inclination of the first side-surface portion and inclination of the second side-surface portion.

11. The device of claim 10, wherein a height of a portion of the first magnetic layer, which corresponds to the second side-surface portion is greater than a height of a portion of the first magnetic layer, which corresponds to the first side-surface portion.

12. The device of claim 10, wherein a height of a portion of the first magnetic layer, which corresponds to the first side-surface portion is 3 nm or less.

13. The device of claim 10, wherein the first magnetic layer contains at least one of iron (Fe) and cobalt (Co).

14. The device of claim 13, wherein the first magnetic layer further contains boron (B).

15. The device of claim 10, wherein the stacked structure includes the second magnetic layer, the nonmagnetic layer, and the first magnetic layer stacked in an order from a lower layer side.

16. The device of the claim 10, wherein the magnetization direction of the first magnetic layer is perpendicular to a main surface thereof, and the magnetization direction of the second magnetic layer is perpendicular to a main surface thereof.

* * * * *